(12) United States Patent
Kim

(10) Patent No.: US 8,416,384 B2
(45) Date of Patent: Apr. 9, 2013

(54) EXPOSING APPARATUS FOR FABRICATING PROCESS OF FLAT PANEL DISPLAY DEVICE

(75) Inventor: Han Hee Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 722 days.

(21) Appl. No.: 12/557,640

(22) Filed: Sep. 11, 2009

(65) Prior Publication Data

US 2010/0141919 A1 Jun. 10, 2010

(30) Foreign Application Priority Data

Dec. 5, 2008 (KR) .................. 10-2008-0122878

(51) Int. Cl.
*G03B 27/52* (2006.01)
*G03B 27/42* (2006.01)
*G03B 27/54* (2006.01)

(52) U.S. Cl.
USPC .................................. 355/30; 355/53; 355/67

(58) Field of Classification Search .............. 355/53, 355/67, 74, 30
See application file for complete search history.

(56) References Cited

U.S. PATENT DOCUMENTS

| 2004/0160583 A1* | 8/2004 | Mulkens et al. ............. 355/30 |
| 2005/0117136 A1* | 6/2005 | Tominaga ................... 355/53 |
| 2005/0264773 A1* | 12/2005 | Beckers et al. ............. 355/30 |
| 2008/0273185 A1* | 11/2008 | Omura et al. ............... 355/67 |
| 2008/0284997 A1* | 11/2008 | Takabayashi ............... 355/53 |

FOREIGN PATENT DOCUMENTS

CN 101034261 A 9/2007

OTHER PUBLICATIONS

Chinese Office Action dated May 31, 2011, with English translation.

* cited by examiner

*Primary Examiner* — Peter B Kim

(74) *Attorney, Agent, or Firm* — Morgan, Lewis & Bockius LLP

(57) ABSTRACT

An exposing apparatus for a fabricating process of a flat panel display device includes a light source emitting a light; a beam edge cutter for improving an uniformity of the light from the light source; an exposing mask under the beam edge cutter and including a pattern; a gas jetting unit between the beam edge cutter and the exposing mask and jetting a gas through a space between the beam edge cutter and the exposing mask; and a stage, where a substrate for the flat panel display device is disposed, under the exposing mask.

12 Claims, 5 Drawing Sheets

EXPOSING APPARATUS FOR FABRICATING PROCESS OF FLAT PANEL DISPLAY DEVICE

The present application claims the benefit of Korean Patent Application No. 10-2008-0122878 filed in Korea on Dec. 5, 2008, which is hereby incorporated by reference.

BACKGROUND OF THE INVENTION

1. Field of the Invention

The present invention relates to an exposing apparatus for a fabricating process of a flat panel display device and more particularly to an exposing apparatus where damage on a beam edge cutter is being capable of being prevented.

2. Discussion of the Related Art

As the society has entered in earnest upon an information age, flat panel display devices, which have excellent capabilities of a thin profile, light weight and low power consumption, and so on, are introduced and used instead of a cathode ray tube (CRT). For example, the flat panel display devices include an LCD device, a plasma display panel (PDP) device, an electroluminescent display (EL) device and a field emission display (FED) device. These flat panel display device includes a flat panel display panel, which includes a pair of substrates and a material layer including a fluorescent material or a phosphorescent material, as an essential member.

Recently, an active matrix type flat panel display device, where pixels are arranged in a matrix shape and a thin film transistor as a switching element is independently controlled, is widely used.

For example, the LED devices, which are widely used for notebook computers, monitors, TV, and so on, because of their high contrast ratio and characteristics adequate to display moving images, includes a liquid crystal panel having a first substrate, a second substrate and a liquid crystal layer. The first and second substrates face each other, and the liquid crystal layer is interposed therebetween. On the first substrate, gate and data lines cross each other to define a pixel region. A thin film transistor (TFT) at a crossing portion of the gate and data lines is connected to a pixel electrode in the pixel region. The first substrate may be referred to as an array substrate. On the second substrate, a black matrix having a lattice shape, a color filter layer and a common electrode are formed. The black matrix shields the gate line, the data line and the TFT, and the color filter layer includes red, green and blue color filter patterns. The common electrode generates an electric field with the pixel electrode to drive the liquid crystal layer. An arrangement of the liquid crystal molecules in the liquid crystal layer is changed by an electric field induced in the liquid crystal panel to control light transmissivity.

Generally, an additional light source is required because the LCD panel is a non-emissive-type display device. Accordingly, a backlight unit is disposed under the LCD panel. The LCD device displays images using light produced by the backlight unit and supplied to the LCD panel.

A fabricating process of the flat panel display devices includes a depositing process for forming a thin film on a substrate, a photolithography process for exposing a portion of the thin film and a patterning process for removing the exposed portion of the thin film.

The photolithography process includes a coating step for forming a photoresist (PR) material layer on the thin film, an exposing step for exposing a portion of the PR material layer using a mask including a desired pattern and a developing step for removing an exposed portion or a non-exposed portion of the PR material layer using a developing solution. A PR pattern having a desired pattern is obtained by the photolithography. As the LCD device having a large size and a high resolution is required, a fine process is required in the exposing step.

FIG. 1 is a perspective view of the related art exposing apparatus. In FIG. 1, the exposing apparatus includes a light source 10 for emitting light, for example, ultraviolet ray or X-ray, a mask 20 including a desired pattern, a stage 30, where a substrate 2 is disposed, and a beam edge cutter 40 for providing uniform light onto the mask 20. The beam edge cutter 40 and the mask 20 are positioned between the light source 10 and the stage 30, and the beam edge cutter 40 is positioned between the light source 10 and the mask 20. The beam edge cutter 40 includes at least one lens (not shown) and a reflex mirror (not shown). On the substrate 2, a thin film 4 and a PR material layer 6 are stacked.

The mask 20 and the beam edge cutter 40 are disposed over the substrate 2 to be parallel such that light emitted from the light source 10 is irradiated onto the PR material layer 6 through the mask 20 and the beam edge cutter 40. As a result, if the PR material is a positive type, an irradiated portion of the PR material layer 6 is chemically changed. In the developing step, the chemically changed portion of the PR material layer 6 is removed using a developing solution such that a PR pattern having the same shape as a pattern of the mask 20 is formed on the thin film 2. Then, the thin film 2 is etched using the PR pattern as an etching mask in the patterning step.

In the above exposing apparatus, a PR material fume is evaporated from the PR material layer 6 during the exposing step. The PR material fume is deposited onto the lens and reflex mirror of the beam edge cutter 40. As a result, transmissivity of the lens and the mirror is degraded such that there are defects on the thin film and a processing efficiency is decreased.

SUMMARY OF THE INVENTION

Accordingly, the present invention is directed to an exposing apparatus for a fabricating process of a flat panel display device that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an exposing apparatus for a fabricating process of a flat panel display device includes a light source emitting a light; a beam edge cutter for improving an uniformity of the light from the light source; an exposing mask under the beam edge cutter and including a pattern; a gas jetting unit between the beam edge cutter and the exposing mask and jetting a gas through a space between the beam edge cutter and the exposing mask; and a stage, where a substrate for the flat panel display device is disposed, under the exposing mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

Figure 1:
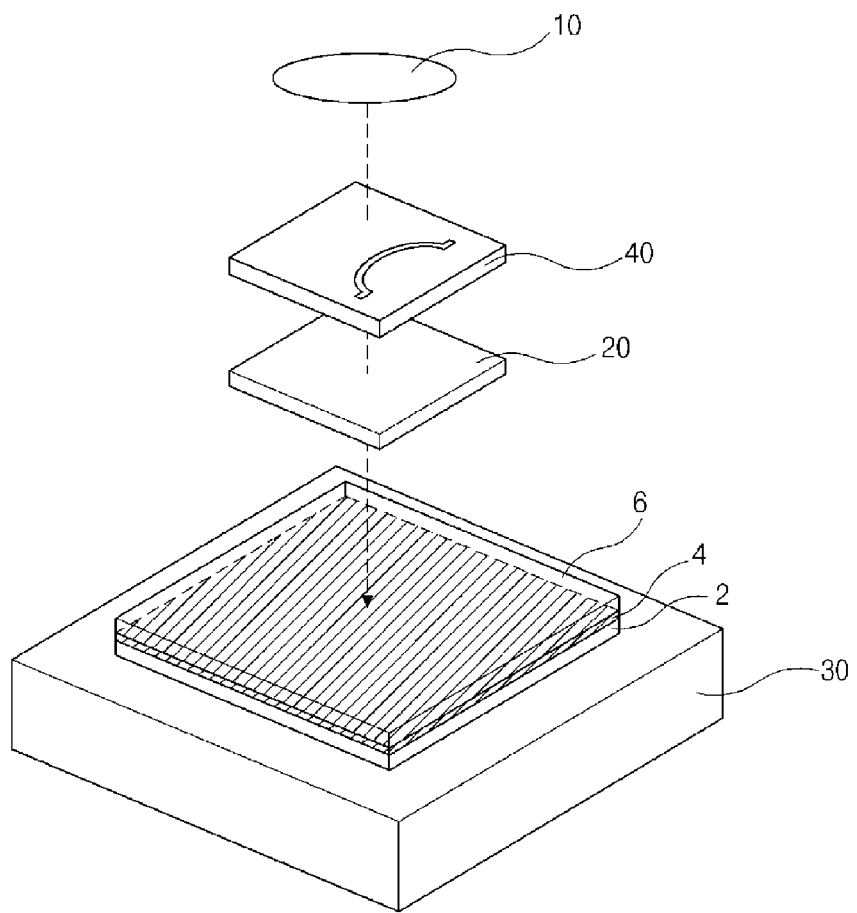
FIG. 1 is a perspective view of the related art exposing apparatus.
Figure 2:
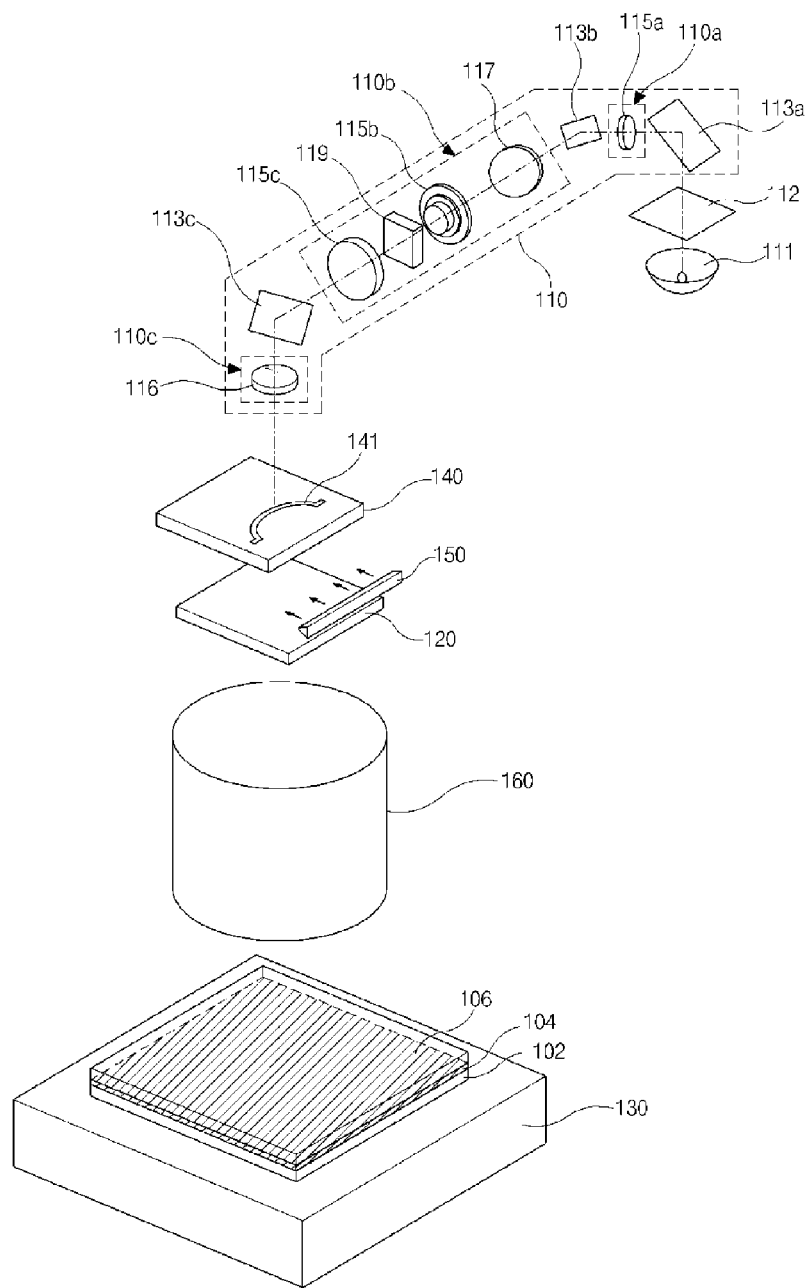
FIG. 2 is a schematic perspective view of an exposing apparatus for a fabricating process of a flat panel display device according to the present invention.

FIG. 2 is a schematic perspective view of an exposing apparatus for a fabricating process of a flat panel display device according to the present invention. In FIG. 2, an exposing apparatus includes a light source 111 emitting light, an illumination unit 110, a beam edge cutter 140, an exposing mask 120, a gas jetting unit 150, an optical unit 160 and a stage 130. The optical unit 160 controls and treats a light path to be irradiated onto a substrate 102 disposed on the stage 130. The exposing apparatus is driven in a scanning type. For example, the beam edge cutter 140 is scanned on an entire surface of the exposing mask 120.

The illumination unit 110 includes a seal glass 112 for blocking a heat from the light source 111, a first optical member 110a for changing the light from the light source 111 into a plane light, a second optical member 110b for improving uniformity of the plane light, a third optical member 110c for concentrating the light and first to third reflex mirrors 113a to 113c for changing a light path. The light 111 from the light source 111 may be one of UV ray and X-ray.

The first optical member 110a is positioned between the first and second reflex mirrors 113a and 113b and includes a first condenser lens 115a and an interference filter (not shown) to change the light from the light source 111 into the plane light.

The second optical member 110b is positioned between the second and third reflex mirrors 113b and 113c and substantially vertical to the first optical member 110a. The second optical member 110b includes a relay lens 117, a second condenser lens 115b, a fly-eye lens 119 and a third condenser lens 115c. The light passing through the first optical member 110a is reflected on the second reflex mirror 113c and has an improved uniformity by the second optical member 110b. The light passing through the second optical member 110b is reflected on the third reflex mirror 113c and provided into the third optical member 110c.

The third optical member 110c is substantially vertical to the second optical member 110b and includes at least one convex lens 116. A straight going property of the light is improved by the third optical member 110c.

The beam edge cutter 140 is positioned between the illumination unit 110 and the exposing mask 120. The light is selectively transmitted through a slit 141 of the beam edge cutter 140 such that the plane light having an improved uniformity is provided onto the exposing mask 120. In more detail, the beam (light) from the illumination unit 110 has a profile of a trapezoid shape. The uniformity of the beam is bad in edges of the trapezoid shape profile. Accordingly, the edges of the beam are cut by the beam edge cutter 140 such that the beam having an improved uniformity can be provided onto the exposing mask 120. The beam edge cutter 140 includes at least two convex lenses 142 and at least two reflex mirrors 143 to concentrate the plane light (see FIG. 4).

The exposing apparatus includes the gas jetting unit 150 over the exposing mask 120 and under the beam edge cutter 140 for preventing damages on the beam edge cutter 140. As mentioned above, a PR material fume is deposited onto the beam edge cutter in the related art exposing process during a photolithography process. However, in the present invention, the damage on the beam edge cutter 140 is prevented due to the gas jetting unit 150. For example, the gas jetting unit 150 may be an air-knife jetting air. The gas jetting unit 150 has a bar shape having substantially the same length as a side of the exposing mask 120. The gas from the gas jetting unit 150 passes between the exposing mask 120 and the beam edge cutter 140 to block the PR material fume. A gas path may be parallel to the exposing mask 120. The gas jetting unit 150 includes a plurality of holes for jetting the gas. The gas may be nitrogen (N2) or cooling dry air (CDA).

The stage 130, where the substrate 102 is disposed, is positioned under the exposing mask 120. A thin film 104 and a PR material layer 106 are stacked on the substrate 102. The light from the illumination unit 110 through the beam edge cutter 140, the exposing mask 120 and the optical unit 160 is irradiated onto the PR material layer 106. The exposing mask 120 includes a desired pattern such that a portion of the PR material layer 120 corresponding to the desired pattern of the exposing mask 120 is exposed to the light. The other portion of the PR material layer 120 is shield by the exposing mask 120. The exposed portion or the shielded portion of the PR material layer 120 is reacted with a developing solution. The PR material layer consists of a solvent, a polymer and a sensitizer. The polymer exposed to the light is resolved or unresolved depending on a property of the sensitizer. Namely, the PR material is classified into a positive type and a negative type depending on a property of the sensitizer. If the PR material is a positive type, an exposed portion of the PR material layer 106 is chemically changed such that the exposed portion is removed by the developing step. As a result, a PR patterning (not shown) corresponding to a pattern of the exposing mask 120 is formed on the thin film 104.

During the exposing step using the above exposing apparatus, a fume is generated from the PR material layer 106. Without the gas jetting unit 150, the fume generates damages on the beam edge cutter 140. For example, the fume is deposited on the convex lens and/or the reflex mirror such that their transmissive property is degraded. However, there is no problem in the present invention due to the gas jetting unit 150.

An exposing quantity is calculated by multiplying an illumination quantity to an exposing time. As the illumination quantity is decreased, the exposing time is increased. Accordingly, if the illumination quantity is decreased because the transmissive property of the beam edge cutter 140 is degraded, an exposing process time is increased such that production yield is reduced. However, since there is no damage on the beam edge cutter 140 due to the gas jetting unit 150 in the present invention, production yield is improved.

Figure 3:
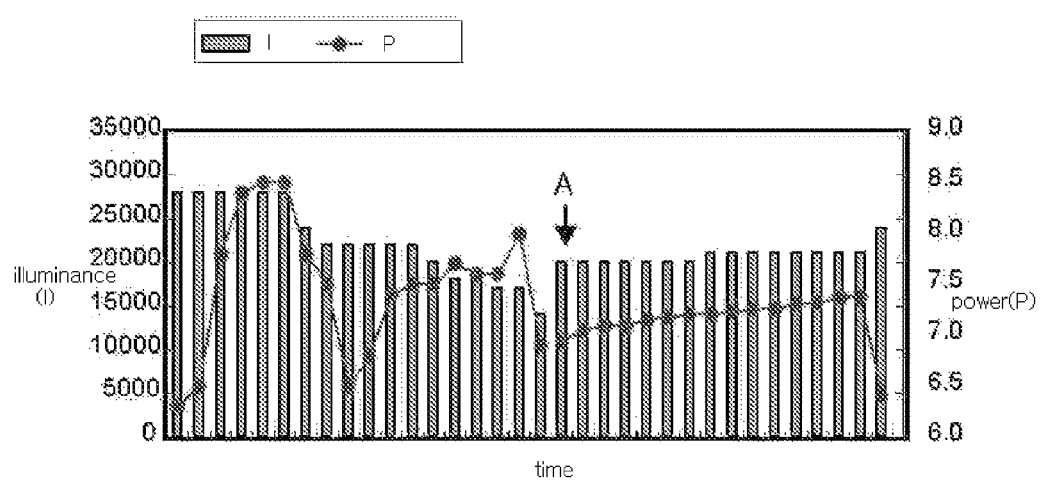
FIG. 3 is a graph illustrating illuminance and power of an exposing apparatus for a fabricating process of a flat panel display device according to the present invention without and with a gas jetting unit.

FIG. 3 is a graph illustrating illuminance and power of an exposing apparatus for a fabricating process of a flat panel display device according to the present invention without and with a gas jetting unit. In FIG. 3, a measuring result without the gas jetting unit is shown in a section before "A", and a measuring result with the gas jetting unit is shown in a section after "A". In the section before A without the gas jetting unit, the illumination quantity is not uniform such that defects are generated on the substrate. However, in the second after "A" with the gas jetting unit 140, the illumination quantity is uniform such that there is no defect on the substrate 102. Namely, in the related art exposing apparatus without the gas jetting unit, the transmissive property of the beam edge cutter 140 is degraded because of the fume from the PR material layer during the exposing step. Meanwhile, in the exposing unit with the gas jetting unit according to the present invention, the above problem is prevented due to the gas jetting unit. As a result, there is no defect on the thin film or the substrate, and production yield is improved.

Figure 4:
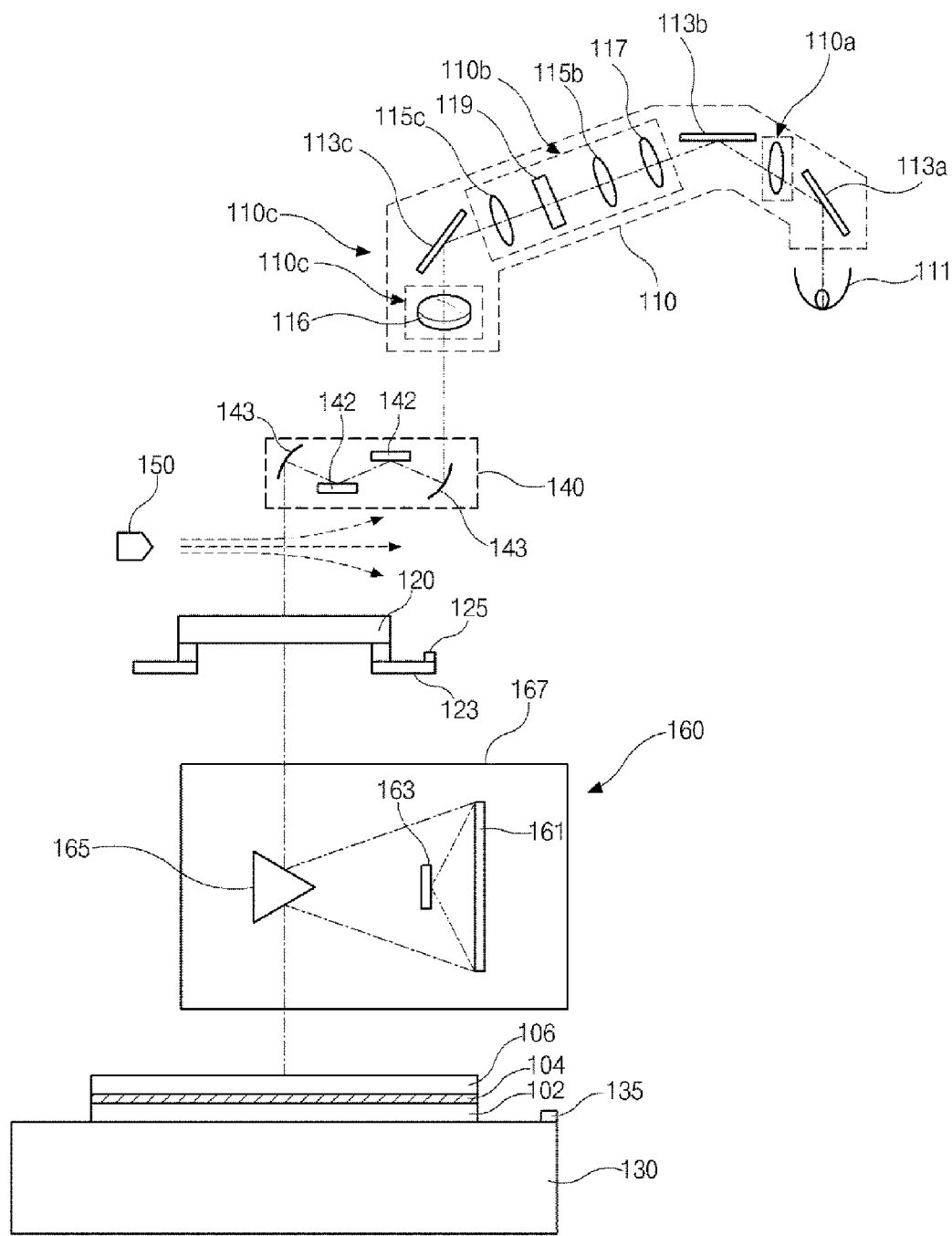
FIG. 4 is a schematic perspective view of an exposing apparatus for a fabricating process of a flat panel display device according to the present invention for illustrating an exposing step.

FIG. 4 is a schematic perspective view of an exposing apparatus for a fabricating process of a flat panel display device according to the present invention for illustrating an exposing step. In FIG. 4, a mask stage 123 and the stage 130 is respectively movable by a driving unit (not shown). A pattern sensor 125 for sensing a position of the exposing mask 120 is disposed at a side of the mask stage 123 such that a positional arrangement becomes accurate.

In addition, a substrate sensor 135 for sensing a position of the substrate 102 is disposed on the stage 130. The substrate sensor 135 may includes a X-axis sensing unit and a Y-axis sensing unit. The exposing process time can be reduced by performing the exposing process after aligning a position of the substrate 102 using the substrate sensor 135. The exposing mask 120 and the substrate 102 on the stage 130 simultaneously move along a direction such that a scan type exposing process is performed on an entire surface of the substrate 102.

The beam edge cutter 140 is positioned between the illumination unit 110 and the exposing mask 120. As mentioned above, the light is selectively transmitted through the beam edge cutter 140 such that the plane light having an improved uniformity is provided onto the exposing mask 120. The beam edge cutter 140 includes at least two reflex mirrors 143 and at least two convex lenses 142. The optical unit 160 includes at least two reflex mirrors 161 and 165 and at least one lens 163. The optical unit 160 is positioned between the exposing mask 120 and the substrate 102 on the stage 130. The optical unit 160 includes an ultra-mirror for preventing a light diffusion by adjusting focus of the light using a mirror. The ultra-mirror is disposed in an inner space of a mirror frame 167 and includes a trapezoid-shape mirror 161, a convex mirror 163, a concave mirror 165 and at least one mirror (not shown). The convex mirror 163 is positioned between the trapezoid-shape mirror 161 and the concave mirror 165.

With FIG. 5, which is a flow chart illustrating a photolithography process using an exposing apparatus for a fabricating process of a flat panel display device according to the present invention, a photolithography process using the above exposing apparatus according to the present invention will be explained below.

Figure 5:
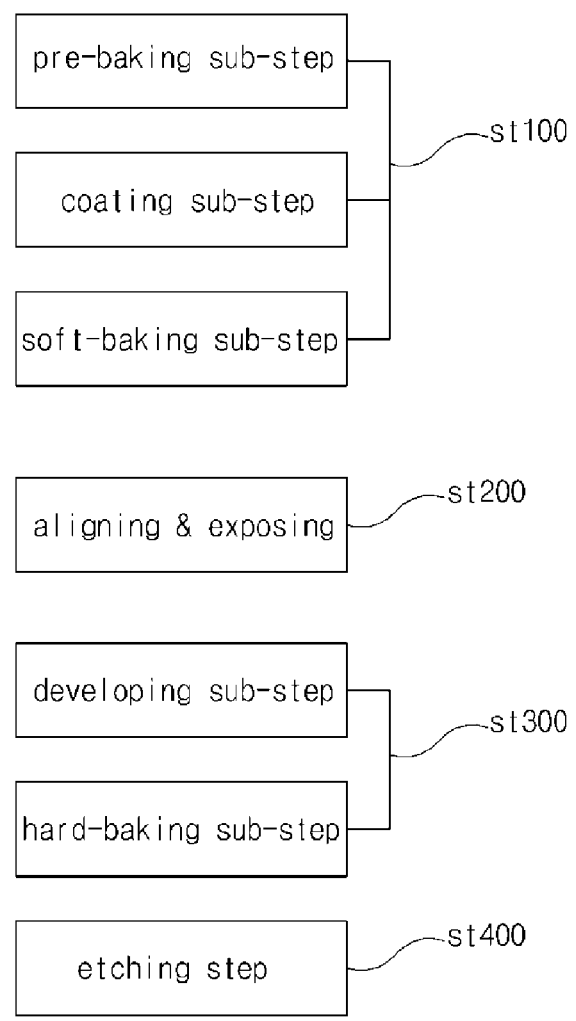
FIG. 5 is a flow chart illustrating a photolithography process using an exposing apparatus for a fabricating process of a flat panel display device according to the present invention.

In FIGS. 4 and 5, the photolithography process includes a coating step "st100", an exposing step "st200" and a developing step "st300". First, the coating step "st100" includes a pre-baking sub-step, a coating sub-step and a soft-baking sub-step to form the PR material layer 106 on the thin film 104 deposited on the substrate 102. In the pre-baking sub-step, moisture on the thin film 104 and the substrate 102 is removed to improve an adhesive property between the thin film 104 (or the substrate 102) and the PR material layer 106. In the coating sub-step, a PR material is coated on the thin film 104 to form the PR material layer 106. For example, the PR material layer 106 may be formed by one of a slit coating method, a spin coating method, a roller coating method and a spinless coating method. In the soft-baking sub-step, a volatile matter, for example, a solvent, in the PR material layer is volatilized using a hot-plate in an in-line process.

In the exposing step "st200", a portion of the PR material layer 106 is exposed to the light and the other portion of the PR material layer 106 is not exposed to the light. Namely, the other portion of the PR material layer 106 is shield. Depending on a property of the PR material, the exposed portion or the non-exposed portion of the PR material layer 106 is chemically changed. The exposing step "st200" is performed by using the exposing apparatus in FIG. 4. As mentioned above, the exposing apparatus includes the gas jetting unit 150 between the exposing mask 120 and the beam edge cutter 140 such that damages on the beam edge cutter 140 resulted from the PR material fume is prevented. As a result, there is no defect on the thin film or the substrate such that production yield is improved. Before the exposing process, the exposing mask 120 and the substrate 102 are aligned.

The developing step "st300" includes a developing sub-step and a hard-baking sub-step. In the developing sub-step, one of the exposed portion or the non-exposed portion of the PR material layer 106 is removed using a developing solution to form a PR pattern having a desired shape. In the hard-baking sub-step, the substrate 102, where the PR pattern is formed, is heated under a pre-determined temperature to remove a remained volatile matter in the PR pattern. As a result, fineness and uniformity of the PR pattern is securitized.

After the photolithography process including the coating step "st100", the exposing step "st200" and the developing step "st300", an etching step "st400" is performed to pattern the thin film 104 using the PR pattern as a mask. Then, an ashing process is performed to remove the PR pattern and a cleaning process is performed.

As mentioned above, since the exposing apparatus includes the gas jetting unit, a PR material fume is not deposited on the beam edge cutter. Accordingly, a transmissive property of the beam edge cutter is to be uniformed, and there is no defect on the thin film or the substrate. In addition, since an exposing process time is decreased, production yield is improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An exposing apparatus for a fabricating process of a flat panel display device, comprising:
a light source configured to emit a light;
a beam edge cutter for improving an uniformity of the light from the light source and comprising:
 a first reflex mirror configured to receive the light from the light source;
 a first convex lens configured to receive the light from the first reflex mirror;
 a second convex lens configured to receive the light from the first convex lens; and
 a second reflex mirror configured to receive the light from the second convex lens;

an exposing mask under the beam edge cutter, exposing mask being configured to receive the light from the beam edge cutter and comprising a pattern;

a gas jetting unit between the beam edge cutter and the exposing mask and configured to jet a gas through a space between the beam edge cutter and the exposing mask; and a stage, where a substrate for the flat panel display device is disposed, under the exposing mask, wherein the light comprises a profile of a trapezoid shape before passing the beam edge cutter, and wherein edges of the light are cut by the beam edge cutter.

2. The apparatus according to claim 1, wherein a thin film and a photoresist material layer are stacked on the substrate.

3. The apparatus according to claim 1, wherein the gas jetting unit has a bar shape having substantially the same length as a side of the exposing mask.

4. The apparatus according to claim 1, wherein the gas includes one of nitrogen and a cooling dry air.

5. The apparatus according to claim 1, further comprising an optical unit for preventing a light diffusion by adjusting focus of the light and positioned between the exposing mask and the substrate.

6. The apparatus according to claim 5, wherein the optical unit includes a trapezoid-shape mirror, a convex mirror, a concave mirror, and at least one additional mirror.

7. The apparatus according to claim 1, further comprising a mask stage, where the exposing mask is disposed, including a sensor for sensing a position of the exposing mask.

8. The apparatus according to claim 1, further comprising a substrate sensor on the stage for sensing a position of the substrate.

9. The apparatus according to claim 1, further comprising an illumination unit for treating the light from the light source into a plane light and improving an uniformity of the plane light, wherein the illumination unit is positioned between the light source and the beam edge cutter making unit.

10. The apparatus according to claim 9, further comprising a seal glass between the light source and the illumination unit for blocking a heat from the light source.

11. The apparatus according to claim 9, wherein the illumination unit includes a first optical member for changing the light from the light source into a plane light, a second optical member for improving an uniformity of the plane light, a third optical member for concentrating the plane light from the second optical member, and first to third reflex mirrors for changing a light path.

12. The apparatus according to claim 11, wherein the first optical member is positioned between the first reflex mirror and the second reflex mirror, the second optical member is positioned between the second reflex mirror and the third reflex mirror, and the third optical member is positioned between the third reflex member and the beam edge cutter.

* * * * *